(12) United States Patent
Liu et al.

(10) Patent No.: US 12,707,937 B2
(45) Date of Patent: Aug. 11, 2026

(54) WAFER RELEASE MECHANISM

(71) Applicant: Taiwan Semiconductor Manufacturing Co., Ltd., Hsinchu (TW)

(72) Inventors: Yan-Hong Liu, Hsinchu (TW); Che-fu Chen, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 630 days.

(21) Appl. No.: 17/815,175

(22) Filed: Jul. 26, 2022

(65) Prior Publication Data

US 2022/0367237 A1 Nov. 17, 2022

Related U.S. Application Data

(62) Division of application No. 16/445,870, filed on Jun. 19, 2019, now Pat. No. 11,456,203.

(Continued)

(51) Int. Cl.
*H01L 21/687* (2006.01)
*G01L 5/00* (2006.01)

(Continued)

(52) U.S. Cl.
CPC ........ *H10P 72/7612* (2026.01); *G01L 5/0076* (2013.01); *H10P 72/72* (2026.01); *H10P 72/78* (2026.01); *H10P 74/20* (2026.01)

(58) Field of Classification Search
CPC ............. G01L 5/0076; H01L 21/67253; H01L 21/67739; H01L 21/6831; H01L 21/6838; H01L 21/68742; H01L 22/10

(Continued)

(56) References Cited

U.S. PATENT DOCUMENTS 5,677,824 A * 10/1997 Harashima .......... H01L 21/6831 118/723 R
6,191,035 B1 * 2/2001 Cheng ............... H01L 21/28568 118/725

(Continued)

FOREIGN PATENT DOCUMENTS

CN 101136353 A * 3/2008 ........... B65G 49/061
JP 2009194346 A 8/2009

(Continued)

OTHER PUBLICATIONS

Machine translation of Shimura et al. Chinese Patent Document CN 101136353 A Mar. 2008 (Year: 2008).*

(Continued)

*Primary Examiner* — Kevin J Comber
(74) *Attorney, Agent, or Firm* — Sterne, Kessler, Goldstein & Fox P.L.L.C.

(57) ABSTRACT

The present disclosure describes a method that prevents pre-mature de-chucking in processing modules. The method includes placing a wafer onto a chuck equipped with lift pins. One or more of the lift pins include a pressure sensor configured to measure a pressure exerted by the wafer. The method further includes measuring a first pressure applied to the one or more lift pins by the wafer, lowering the lift pins to place the wafer on the chuck, and processing the wafer. The method also includes removing the wafer from the chuck by pressing the one or more lift pins against the wafer to measure a second pressure exerted by the wafer. If the measured second pressure is equal to the first pressure, the method raises the wafer using the lift pins above the chuck.

20 Claims, 11 Drawing Sheets

Related U.S. Application Data

(60) Provisional application No. 62/697,473, filed on Jul. 13, 2018.

(51) Int. Cl.
*H01L 21/66* (2006.01)
*H01L 21/683* (2006.01)
*H10P 72/72* (2026.01)
*H10P 72/76* (2026.01)
*H10P 72/78* (2026.01)
*H10P 74/20* (2026.01)

(58) Field of Classification Search
USPC .......................................................... 361/234
See application file for complete search history.

(56) References Cited

U.S. PATENT DOCUMENTS 8,057,602 B2 11/2011 Koelmel et al.
2004/0182311 A1 9/2004 Hanazaki
2005/0278064 A1 12/2005 Moulin et al.
2007/0089834 A1 4/2007 Brillhart et al.
2008/0179291 A1 7/2008 Collins et al.
2010/0032096 A1 2/2010 Yu et al.
2010/0075488 A1 3/2010 Collins et al.
2011/0037456 A1* 2/2011 Chemisky ............ G01D 3/0365 324/105
2013/0153147 A1 6/2013 Senzaki et al.
2016/0025528 A1 1/2016 Chemisky et al.
2017/0032983 A1 2/2017 Muta et al.
2017/0365531 A1 12/2017 Tedeschi et al.
2018/0025931 A1 1/2018 Nemani et al.
2019/0198299 A1* 6/2019 Watanabe ......... H01L 21/67115

FOREIGN PATENT DOCUMENTS

JP 2012115766 A 6/2012
KR 2008022754 A * 3/2008 ........ H01J 37/32449
TW 201037818 A 10/2010
TW 201320237 A 5/2013
WO WO-2009023133 A1 2/2009

OTHER PUBLICATIONS

Machine translation of Son Korean Patent Document KR 20080022754 A Mar. 2008 (Year: 2008).*

* cited by examiner

WAFER RELEASE MECHANISM

CROSS-REFERENCE TO RELATED APPLICATION

This patent application is a divisional of U.S. patent application Ser. No. 16/445,870, filed on Jun. 19, 2019, titled "Wafer Release Mechanism," which claims the benefit of U.S. Provisional Patent Application No. 62/697,473, filed on Jul. 13, 2018, titled "Wafer Release Mechanism," both of which are incorporated herein by reference in their entireties.

BACKGROUND

A chuck of a processing module can include a wafer lift mechanism that may or may not be part of the chuck's assembly. The wafer lift mechanism is configured to raise the wafer above the chuck so that the wafer can be transferred out of the processing module.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
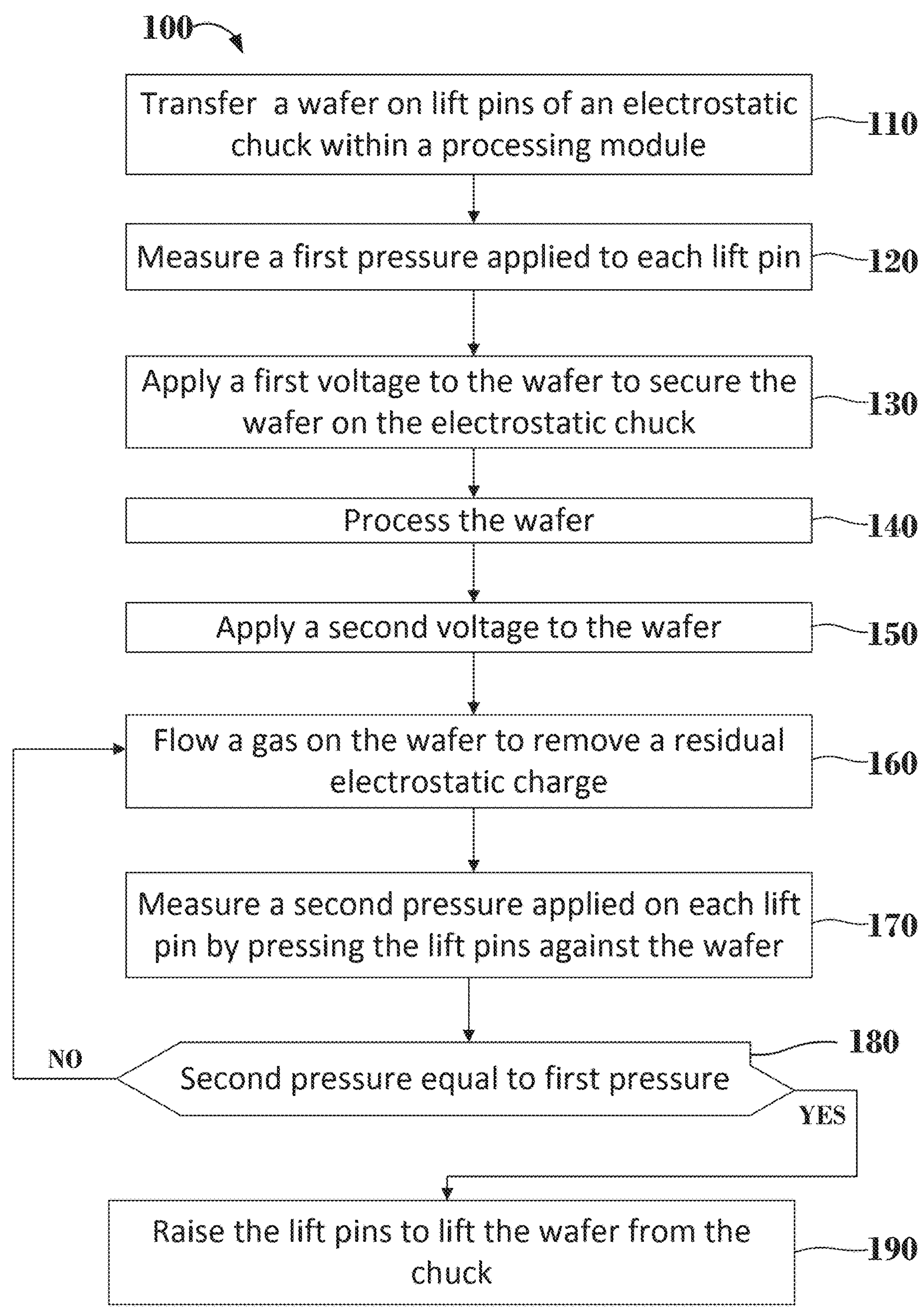
FIG. 1 is flow chart of a method that describes a dc-chucking sequence for an electrostatic chuck, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value).

The term "vertical," as used herein, means nominally perpendicular to the surface of a substrate.

During semiconductor fabrication, wafers made of semiconducting or dielectric material are processed in processing modules. Wafer processing includes transferring the wafer into the processing module, placing the wafer on a wafer chuck, processing the wafer, lifting the wafer from the wafer chuck, and removing the wafer from the processing module. During processing, the wafer chuck is configured to secure the wafer, heat the wafer, bias the wafer (e.g., apply voltage to the wafer), or combinations thereof. Securing the wafer during processing can be accomplished either by means of electrostatic force (e.g., in the case of electrostatic chucks) or by means of a vacuum (e.g., in the case of vacuum chucks). The sequence of operations to place and secure a wafer on a chuck is referred to as "chucking" and the sequence of operations to lift the wafer from the chuck, so that it can be transferred outside the processing module, is referred to as "de-chucking."

The de-chucking sequence can include a wafer lift mechanism (e.g., lift pins or a ring) that may or may not be part of the chuck assembly, which is configured to lift the wafer in a vertical direction above the chuck so that the wafer can be transferred (e.g., via a robotic arm) out of the processing module. If there is "premature" de-chucking—in other words, if the wafer lift mechanism attempts to raise the wafer while a downforce is present on the wafer other than its own weight—a stress may be induced across the wafer. The induced stress can cause material delamination from the wafer. Consequently, as a result of premature de-chucking, wafers may fracture or develop other defects, which can be detrimental for subsequent processes. In certain cases, premature de-chucking may break the wafer inside the processing module.

The present disclose is directed to a method that prevents pre-mature de-chucking in processing modules. Embodiments of the method utilize a wafer lift mechanism that includes pressure sensors, which are configured to measure downforces applied to the wafer lift mechanism through the wafer prior to attempting to lift the wafer from the chuck (e.g., during the de-chucking process). According to some embodiments, if the measured pressure is equal to the pressure corresponding to the weight of the wafer, the lift mechanism can raise the wafer from the chuck. Accordingly, if the measured pressure is greater than the pressure corresponding to the weight of the wafer, the wafer may remain on the chuck until the measured pressure becomes equal to the pressure corresponding to the weight of the wafer. In some embodiments, the wafer lift mechanism includes lifting pins with pressure sensors thereon. The pressure sensors can communicate a pressure reading to a unit that controls the movement of the lifting mechanism either via a wired connection or wireless communication.

FIG. 1 is an exemplary method 100 that describes a de-chucking sequence, according to some embodiments. The de-chucking sequence described in method 100 of FIG. 1 utilizes an electrostatic chuck with lift pins, which include pressure sensors. According to some embodiments, the pressure sensors are configured to measure a pressure that corresponds to downward forces (e.g., downforces) applied to a wafer during the de-chucking process. This disclosure is not limited to this operational description. It is to be appreciated that additional operations may be performed. Moreover, not all operations may be needed to perform the disclosure provided herein. Further, some of the operations may be performed simultaneously, or in a different order than shown in FIG. 1. In some implementations, one or more other operations may be performed in addition to or in place of the presently described operations. For illustrative purposes, method 100 is described with reference to the embodiments of FIGS. 2 through 8.

Figure 2:
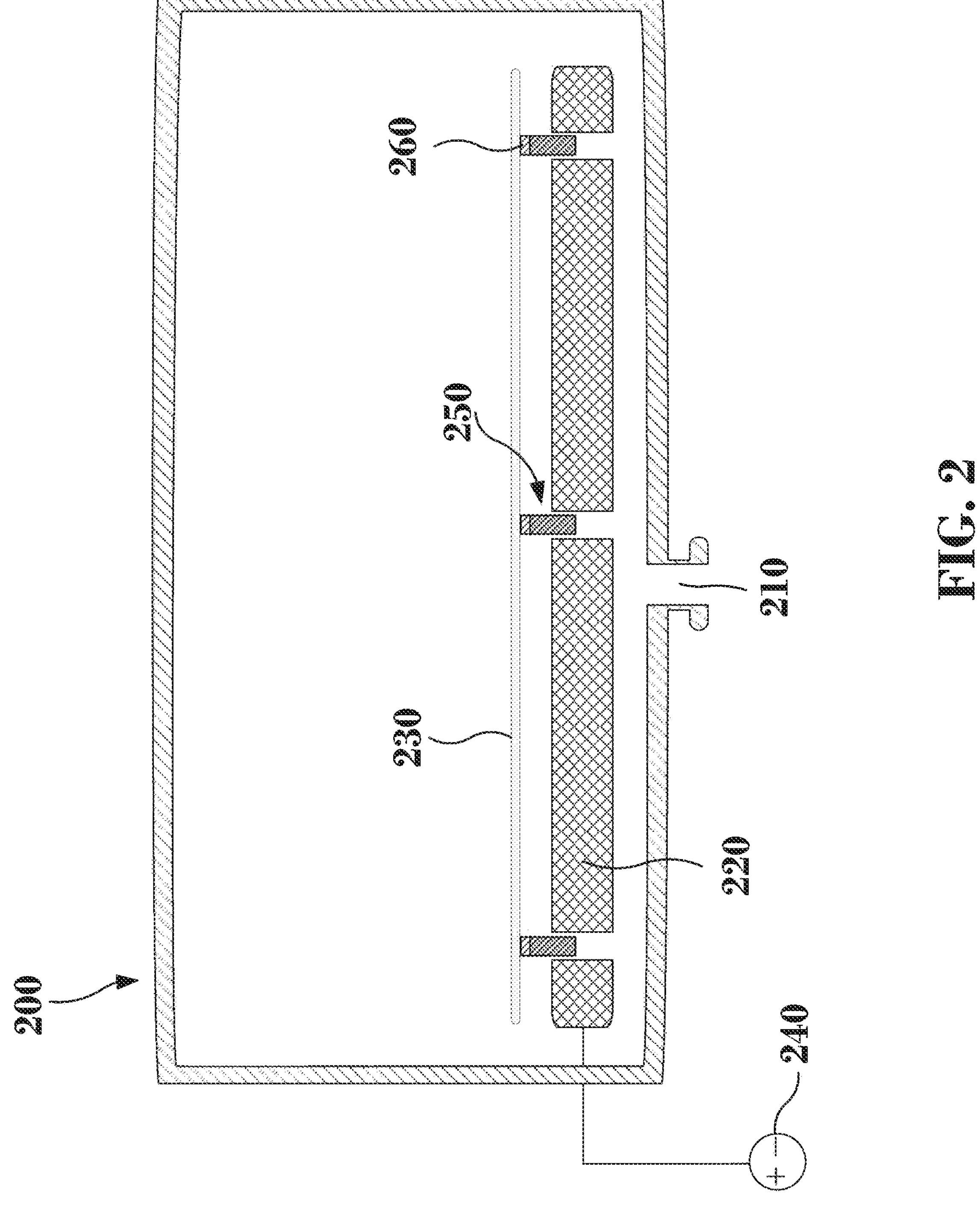
FIG. 2 is a cross-sectional view of an exemplary processing module with a wafer resting on the lift pins of the module's chuck, according to some embodiments.

Exemplary method 100 begins with operation 110, where a wafer is transferred into a processing module and placed on the lift pins of the module's electrostatic chuck. By way of example and not limitation, FIG. 2 is a cross-sectional view of an exemplary processing module 200. For illustration purposes, FIG. 2 includes selected portions of processing module 200 and other portions (not shown) may be included. The portions, which are not shown in FIG. 2, include but are not limited to chemical delivery lines, thermocouples, pressure sensors, control units, transfer modules, pumps, slot/gate valves, electronic components, robotic arms, etc.

Processing module 200 includes one or more exhaust openings 210 and a chuck 220. In some embodiments, chuck 220 is an electrostatic chuck (ESC) that can bias wafer 230 (e.g., apply a voltage to wafer 230) during processing, during a chucking operation, or during a de-chucking operation. By way of example and not limitation, chuck 220 can be connected to one or more external power supplies 240 that can provide a direct current (DC) voltage.

Chuck 220 further includes a wafer lift mechanism that includes lift pins 250. However, this is not limiting and the wafer lift mechanism can alternatively include a lift ring or other similar elements. Lift pins 250 can be physically connected to pistons or another electromechanical system (not shown in FIG. 2) that can raise/lower lift pins 250 and wafer 230 in the vertical direction. According to some embodiments, a pressure sensor 260 is attached to a top surface of each lift pin 250.

Figure 3:
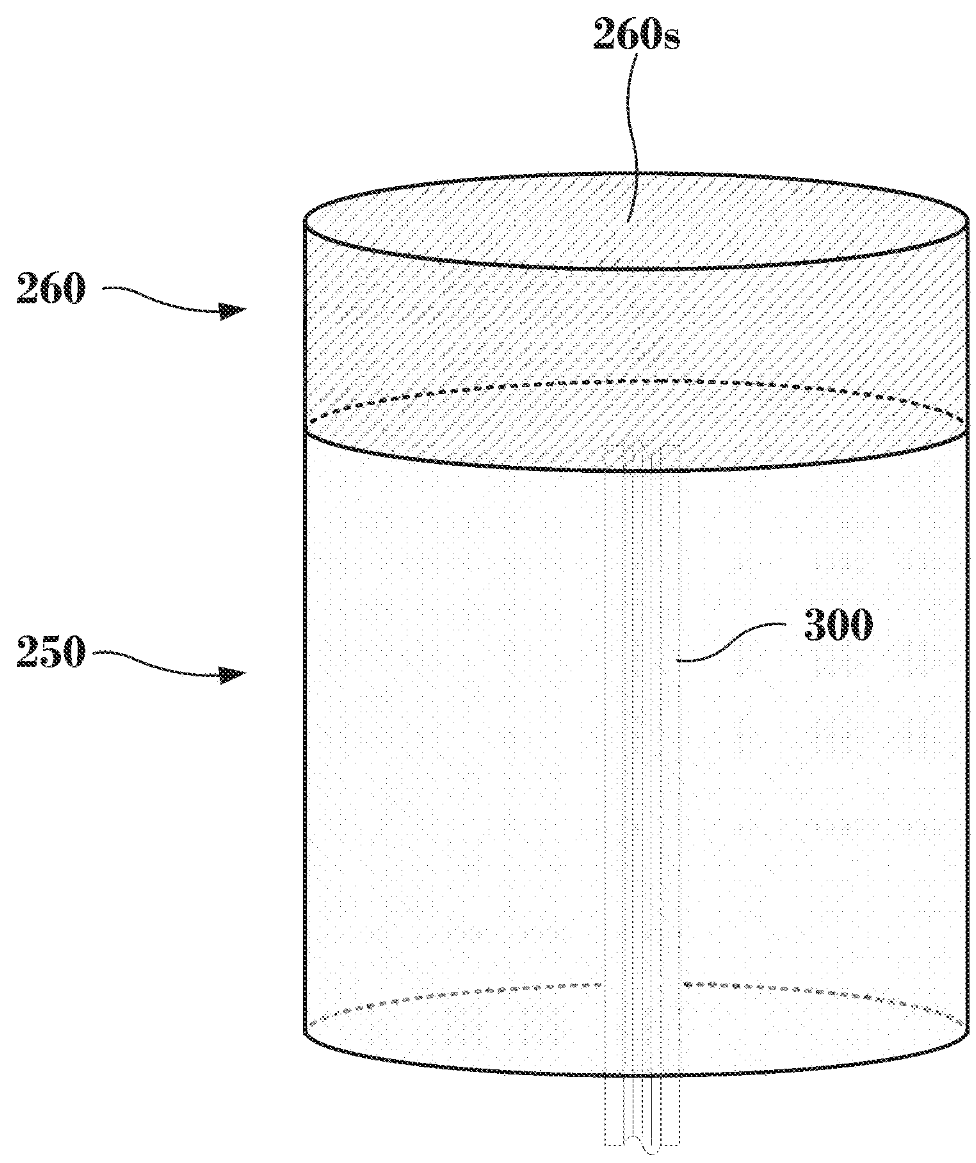
FIG. 3 is magnified isometric view with a pressure sensor on a lift pin of a chuck, according to some embodiments.

According to some embodiments, FIG. 3 is a magnified isometric view of lift pin 250 with pressure sensor 260 thereon. For illustration purposes, FIG. 3 includes a selected portion of lift pin 250 and other portions (not shown) may be included. In some embodiments, pressure sensor 260 has a diameter that ranges from about 1 mm to about 5 mm. Lift pin 250 and pressure sensor 260 may not be limited to the example of FIG. 3 and can have alternative shapes (e.g., rectangular shape, polygonal shape, etc.) By way of example and not limitation, pressure sensor 260 can cover the top surface of lift pin 250 as shown in FIG. 3. In some embodiments, lift pin 250 can have a hollow body to accommodate wires 300 of pressure sensor 260. For example, wires 300 can be connected to an external unit that can process the signals transmitted by pressure sensor 260. Alternatively, pressure sensor 260 may transmit a signal wirelessly. For example, pressure sensor 260 may include a radio frequency (RF) transmitter, a Bluetooth (BT) transmitter, or another suitable transmitter. In some embodiments, lift pin 250 can be cooled to maintain the temperature of pressure sensor 260 below a predetermined value (e.g. below 110° C.). For example, cooled water may be circulated in a portion of the lift pin's hollow body. In some embodiments, top surface 260*s* comes in contact with the bottom surface (e.g., the "backside" surface or the "unprocessed" surface) of wafer 230.

By way of example and not limitation, pressure sensor 260 can be a piezoresistive pressure sensor, an electromagnetic pressure sensor, a capacitive pressure sensor, a piezoelectric pressure sensor, an optical pressure sensor, or another suitable sensor that can be attached to lift pin 250.

Figure 4:
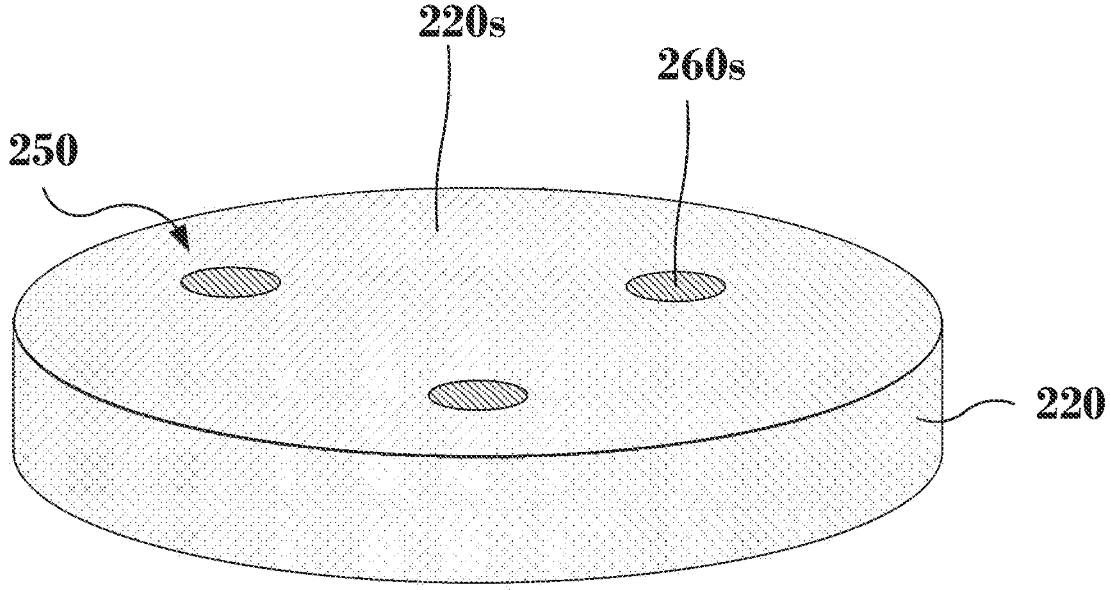
FIG. 4 is an isometric view of a chuck with retracted lift pins having pressure sensors thereon, according to some embodiments.

According to some embodiments, FIG. 4 is an isometric view of chuck 220 with lift pins 250 retracted. In some embodiments, when lift pins 250 are retracted, top surface 260*s* of pressure sensor 260 can be substantially coplanar with a top surface 220*s* of chuck 220. In some embodiments, top surface 260*s* of pressure sensor 260 can be below top surface 220*s* of chuck 220. Therefore, pressure sensors 260 may or may not be in contact with the backside of wafer 230 when lift pins 250 are retracted.

Figure 5:
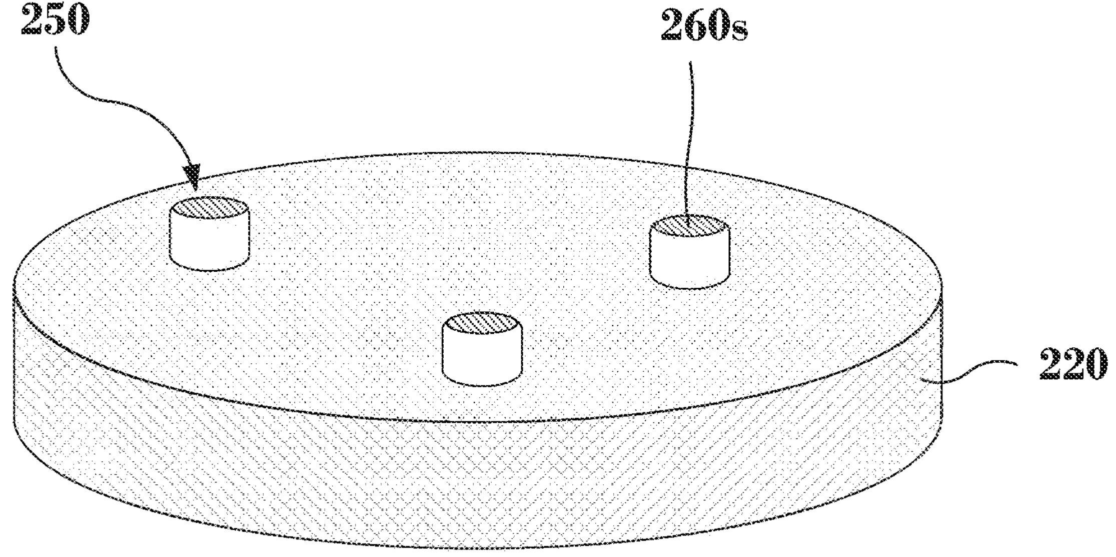
FIG. 5 is an isometric view of a chuck with raised lift pins having pressure sensors thereon, according to some embodiments.

According to some embodiments, FIG. 5 is an isometric view of chuck 220 with lift pins 250 raised. When lift pins 250 are raised, wafer 230 rests on top surface 260*s* of pressure sensors 260. In some embodiments, when lift pins 250 are raised and wafer 230 rests on top surface 260*s* of pressure sensors 260, pressure sensors 260 can measure a pressure that corresponds to the downward forces (e.g., downforce) exerted on lift pins 250, such as the weight of the wafer. For example, the pressure on each lift pin 250 (in the vertical direction) when wafer 230 is resting on raised lift pins 250 can be described with the following formula:

$$P1 = \frac{\text{Force due to the wafer weight}}{\text{Area of pressure sensor} \times \text{Number of lift pins}},$$

where the "Area of the pressure sensor" refers to the area of pressure sensor 260 in contact with wafer 230—e.g., area of top surface 260*s*. From the above equation, the weight of the wafer can be calculated if the area of top surface 260*s* is known.

Figure 6:
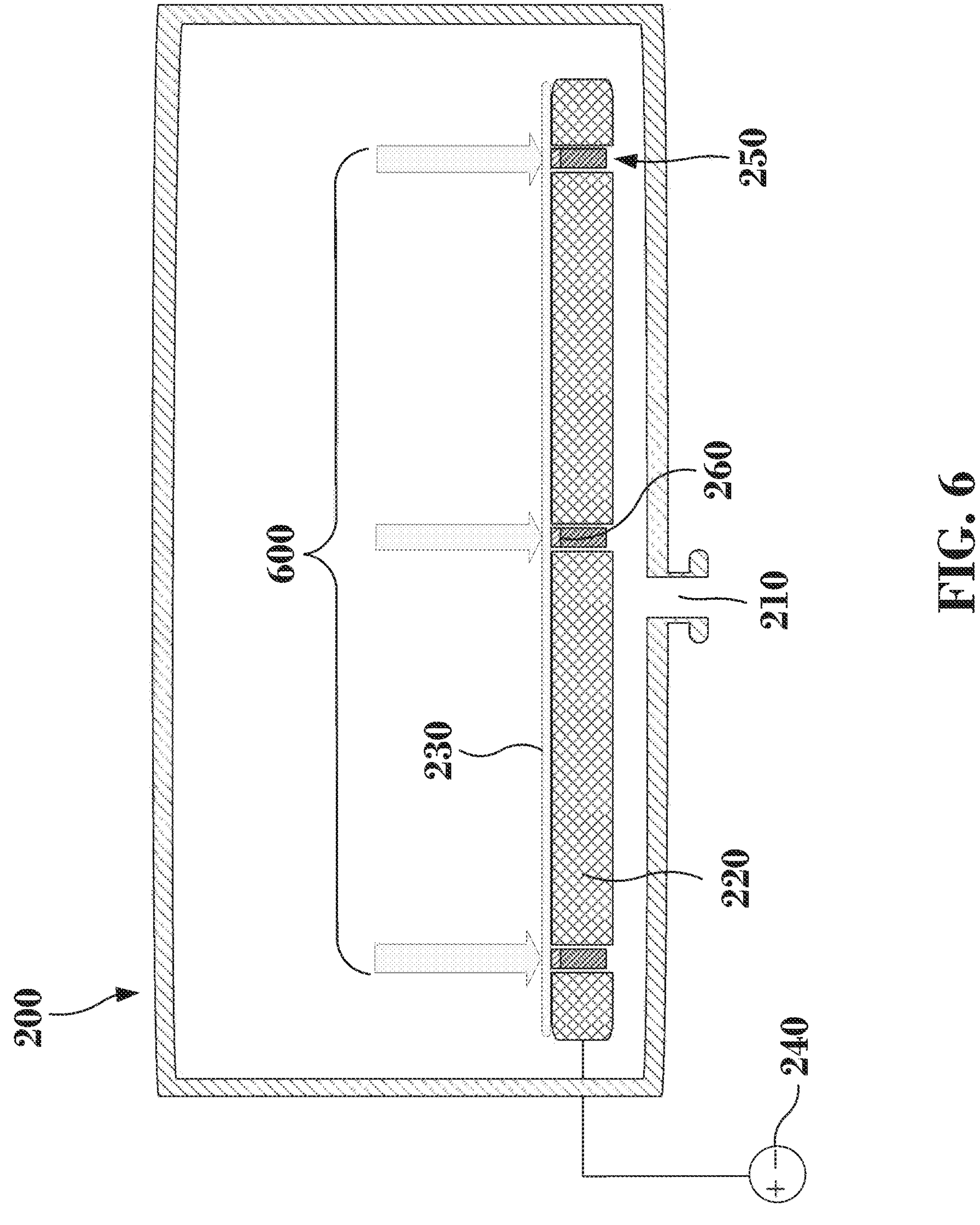
FIG. 6 is a cross-sectional view of an exemplary processing module with a wafer resting on the module's chuck and forces applied on the wafer, according to some embodiments.

When lift pins 250 are retracted, as shown in FIG. 4, but pressed against wafer 230 that is resting on chuck 220, pressure sensors 260 can measure a pressure that corresponds not only to the weight of wafer 230, but also additional forces exerted on wafer 230. Such forces can include, for example, electrostatic forces from chuck 220. In other words, the measured pressure on each lift pin 250 can be described with the following formula:

$$P2 = \frac{\sum_1^n F_n}{\text{Area of pressure sensor} \times \text{Number of lift pins}},$$

where the numerator is the sum of the forces exerted on wafer 230. For example, the numerator can include, but is not limited to, electrostatic forces from an electrostatic chuck. In addition, the numerator can also include the weight of the wafer. In some embodiments, if chuck 220 is a vacuum chuck (e.g. a chuck that creates a pressure differential between the top surface and the backside surface of wafer 230) the numerator corresponds to a force associated with the differential pressure applied on wafer 230, as opposed to an electrostatic component. In the case of an electrostatic chuck, P2 takes the form:

$$P2 = \frac{\text{Force due to the wafer weight} + F_{ES}}{\text{Area of pressure sensor} \times \text{Number of lift pins}},$$

where $F_{ES}$ is the electrostatic force that wafer 230 experiences on an electrostatic chuck 220. FIG. 6 shows schematically the forces 600 applied to pressure sensors 260 when wafer 230 is resting on chuck 220 and lift pins 250 are pressed against wafer 230, according to some embodiments.

Figure 7:
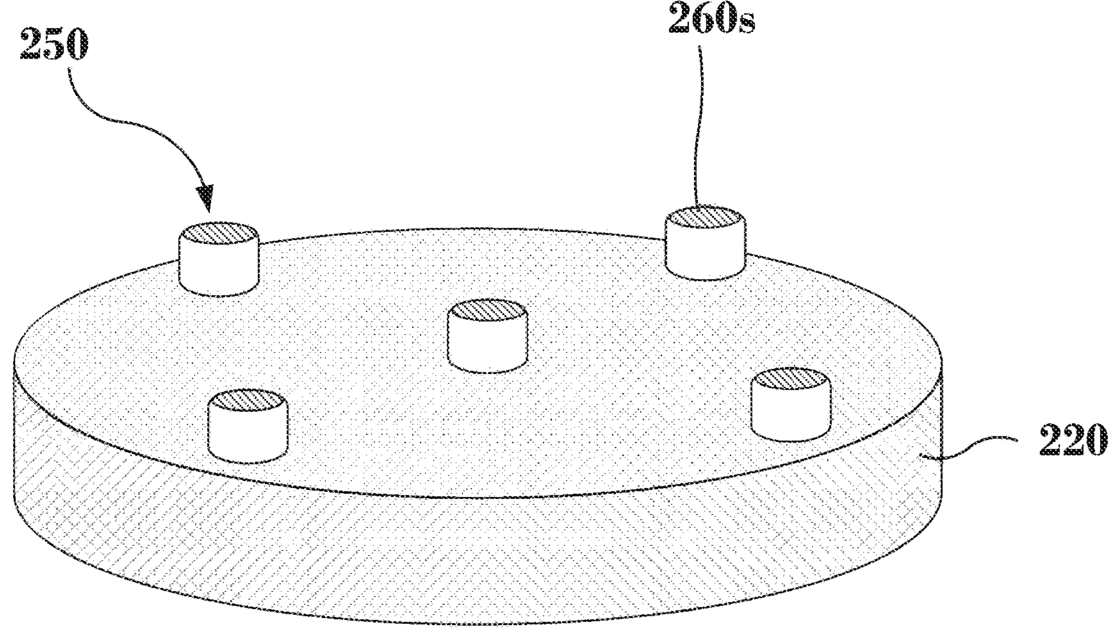
FIGS. 7 and 8 are isometric views of a chuck with exemplary lift pin and pressure sensor configurations, according to some embodiments.
Figure 8:
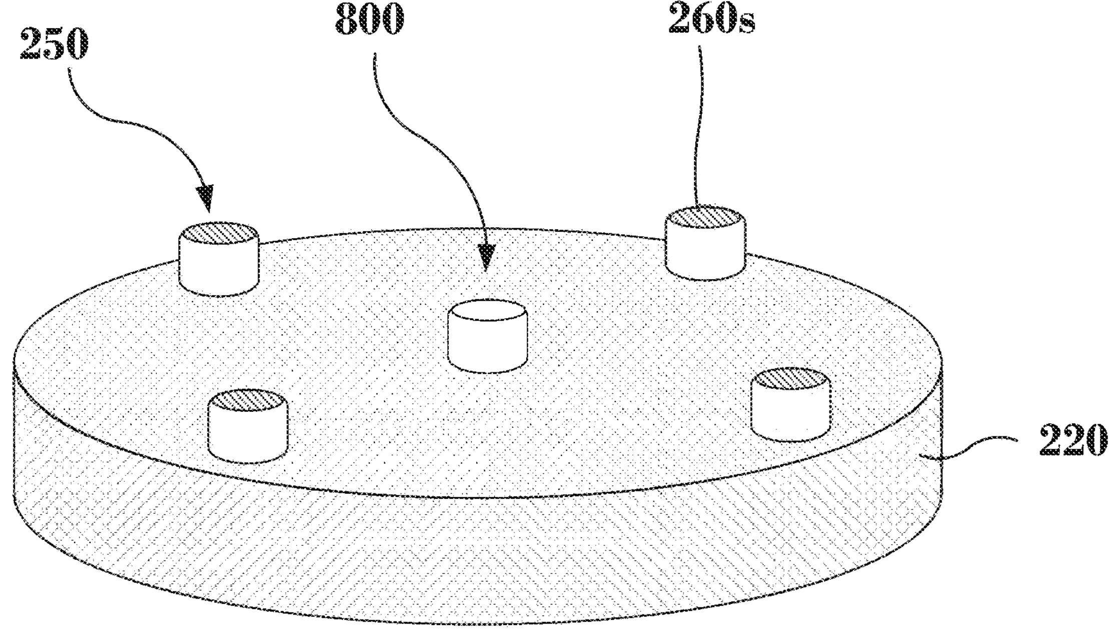

According to some embodiments, the number of lift pins 250 is not limited to the examples of FIGS. 2 and 4-6. Consequently, a chuck with additional lifts pins 250 is possible (e.g., with 4, 5, 6, or 8 lift pins) in a variety of configurations. For example, according to some embodiments, FIG. 7 is an isometric view of chuck 220 with a different number of lift pins 250 (e.g., with 5 lift pins). In some embodiments, pressure sensors 260 may be disposed on a subset of lift pins 250, as shown in FIG. 8, where raised lift pin 800 does not include a pressure sensor 260. These and other alternative configurations are within the spirit and the scope of this disclosure.

In referring to FIG. 1, exemplary method 100 continues with operation 120, where a first pressure, P1, applied to each lift pin 250 is measured. As discussed above, and referring to FIG. 2, the measured first pressure, P1, corresponds to the weight of wafer 230. From the reading of pressure P1, the weight of wafer 230 can be calculated as long as the area of top surface 260*s* of pressure sensors 260 is known. By way of example and not limitation, the first pressure can be communicated to and stored by a control unit via wires 300 (shown in FIG. 3) or by wireless means, as discuss above. Once the first pressure is measured, lift pins 250 are lowered in chuck 220 until the backside surface of wafer 230 is resting on chuck 220 as shown in FIG. 6.

In referring to FIG. 1, exemplary method 100 continues with operation 130. In operation 130, a first voltage is applied by power supply 240 (shown in FIG. 6) through chuck 220 on wafer 230. The polarity and magnitude (e.g., biasing conditions) of the applied first voltage on wafer 230 depend on the processing conditions in processing module 200. According to some embodiments, applied first voltage (e.g., bias) on wafer 230 induces a charge on wafer 230 that results in the formation of electrostatic forces between the wafer and the chuck that prevent wafer 230 from "sliding" (e.g., relocating) over the top surface of chuck 220 during processing. In some embodiments, the first applied voltage or bias is a DC voltage.

Referring to FIG. 1, exemplary method 100 continues with operation 140, where wafer 230 is processed in processing module 200. By way of example and not limitation, processing can include material deposition (e.g., metal, dielectric, semiconducting, etc.), material etching, chemical mechanical polishing, cleaning processes, photolithography operations, or any operations employed in a semiconductor manufacturing facility.

In operation 150, a second voltage (or bias) is applied to wafer 230 when wafer processing in processing module 200 has concluded. In some embodiments, the second voltage applied to wafer 230 during operation 150 has an opposite polarity to the first voltage and a magnitude that is equal to or different than the magnitude of the first voltage in operation 130. In some embodiments, the second voltage (or bias) in operation 150 is a "reversed voltage" or a "reversed bias" with respect to the first voltage of operation 130. A purpose of the second voltage in operation 150 is to remove the induced charge from the first voltage and reverse the electrostatic force applied to wafer 230 and, therefore, "release" wafer 230 so that it can be de-chucked.

However, occasionally the reverse voltage (second voltage) may not fully remove the charge from wafer 230 (e.g., when for example there is no conductive path for the charge to escape). Consequently, a residual charge may remain on wafer 230 even after the application of the reverse voltage (second voltage) of operation 150. To remove any residual charge, a gas is flown on wafer 230, according to operation 160. In some embodiments, the gas is an inert gas that does not react with the materials present on wafer 230. By way of example and not limitation, the gas can include helium, argon, xenon, neon and the like. The gas can be released on wafer 230 in processing module 200 via a gas line (not shown in FIGS. 2 and 6) located either above or below the level of wafer 230. For example, the gas can be released in processing module 200 via one or more gas lines located on a sidewall of processing module 200. Further, the gas can escape from processing module 200 through the one or more exhaust openings 210.

In operation 170, lift pins 250 are pressed against the backside surface of wafer 230 as shown in FIG. 6. Pressure sensors 260 can measure a second pressure P2 on each lift pin 250, according to the P2 formula described above. In some embodiments, the second pressure P2 corresponds to the sum of the downforces exerted on lift pins 250 due to (i) the weight of wafer 230, and (ii) the electrostatic forces attributed to a residual electrostatic charge on wafer 230.

In operation 180 of FIG. 1, a determination is made whether the second pressure is equal to the first pressure. For example, if operation 160 removes the residual electrostatic charge on wafer 230, second pressure P2 will be equal to first pressure P1. Therefore, wafer 230 can be raised by lifting pins 250 (e.g., wafer 230 is de-chucked) in operation 190 of exemplary method 100. If the second pressure is higher than the first pressure, then operation 160 can be repeated. For example, in the event that a residual electrostatic charge is still present on wafer 230, the second pressure measurement in operation 170 will be greater than the pressure measurement in operation 120 (e.g., P2>P1). Therefore, operation 160 can be repeated until the measured pressure in operation 170 becomes equal to first pressure P1 measured in operation 120. For example, after operation 160 has been repeated, pressure sensors 260 are pressed against wafer 230 to measure a "third pressure P3." In operation 180 of FIG. 1, a determination is made whether the second pressure is equal to the first pressure. If third pressure P3 is equal to first pressure P1, wafer 230 can be de-chucked according to operation 190, otherwise operation 160 can be repeated again.

In some embodiments, operation 170 may be performed concurrently with operation 160. For example, the gas in operation 160 is flown while the second pressure P2 is measured according to operation 170. In some embodiments, and at the beginning of operation 160, second pressure P2 is greater than first pressure P1. However, over time, second pressure P2 becomes equal to pressure P1 as the residual electrostatic charge on wafer 230 is removed. This scenario is not limiting and operation 170 may begin after operation 160, and second pressure P2 can be measured once operation 160 has concluded (e.g., when the gas has stopped flowing). From the above description, pressure sensors 260 can measure the pressure either continuously or intermittently during operation 160 or at the end of operation 160. According to some embodiments, different combinations and permutations of operations 160 through 190 of exemplary method 100 are within the spirit and the scope of this disclosure.

Figure 10:
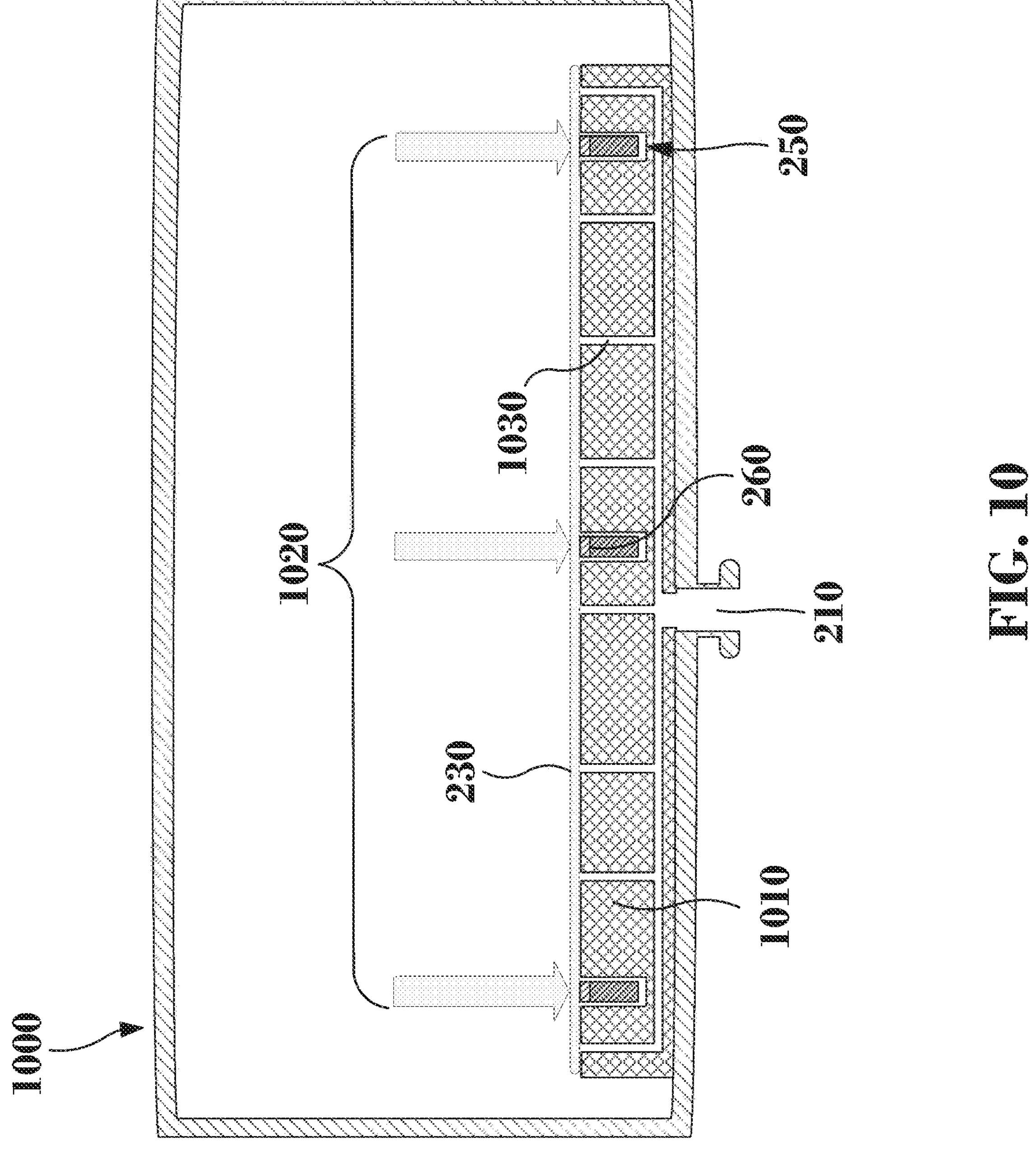
FIG. 10 is a cross-sectional view of an exemplary processing module with a wafer resting on the lift pins of the module's chuck, according to some embodiments.

Exemplary method 100 was described for an electrostatic chuck. However, exemplary method 100 may not be limited to electrostatic chucks and can be applied to other types of chucks, such as vacuum chucks. FIG. 10 is a cross-sectional view of an exemplary processing module 1000 with a vacuum chuck 1010. For vacuum chuck 1010 the second pressure P2 has a component corresponding to the differential pressure between the top and the backside surface of wafer 230, as opposed to an electrostatic component. In other words, this differential pressure between the top and the backside surface of wafer 230 is manifested as an additional downforce 1020 on wafer 230. This additional downforce 1020 can secure wafer 230 on vacuum chuck 1010 during processing. Additionally, in the case of vacuum chuck 1010, an application of a voltage to wafer 230 through vacuum chuck 1010 is not necessary.

Figure 9:
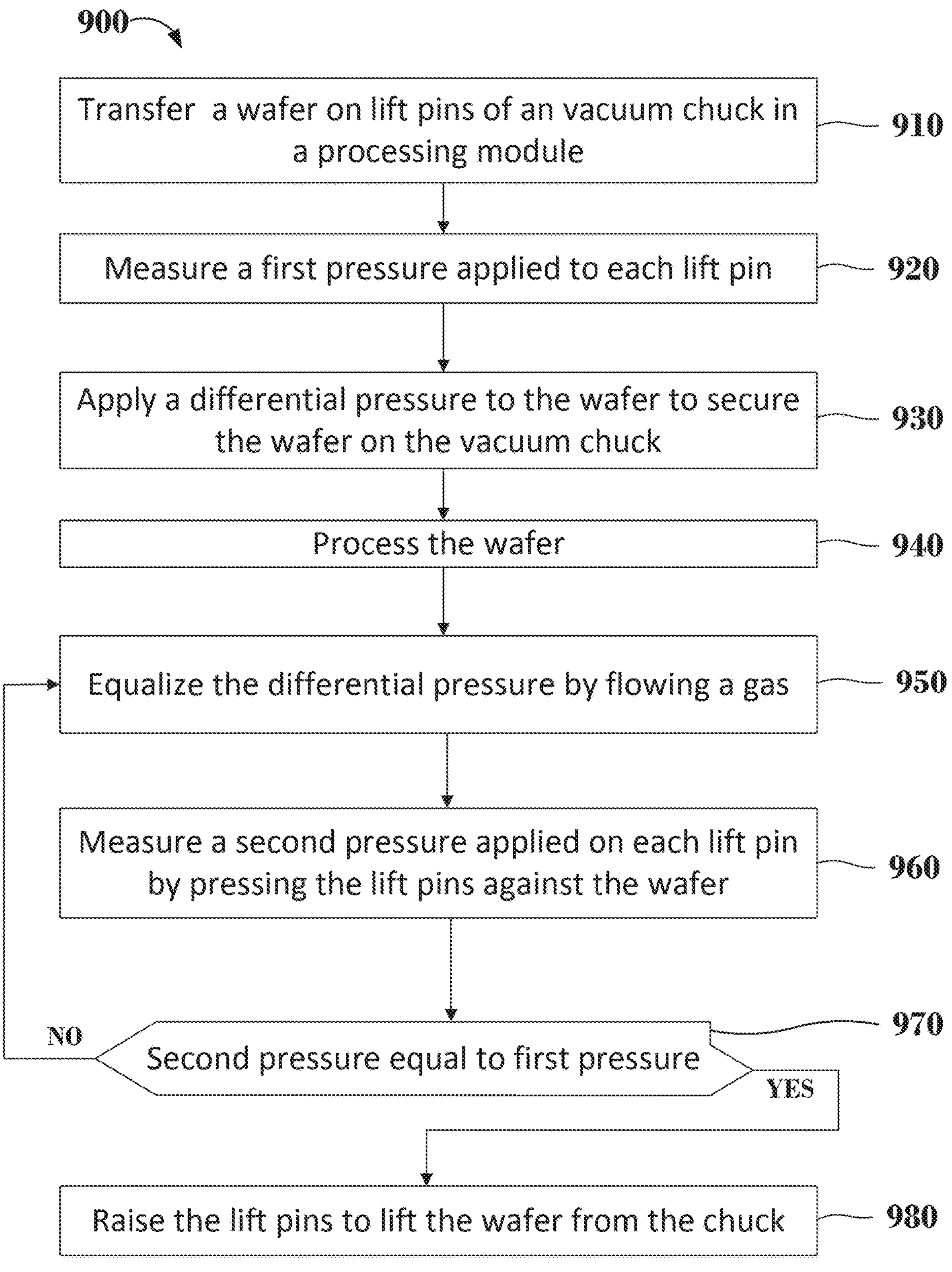
FIG. 9 is flow chart of a method that describes a de-chucking sequence for a vacuum chuck, according to some embodiments.

By way of example and not limitation, FIG. 9 is an exemplary method 900 that describes a de-chucking sequence, according to some embodiments. The de-chucking sequence described in method 900 of FIG. 9 utilizes vacuum chuck 1010 with lift pins 250, which include pressure sensors 260, as shown in FIG. 10. According to some embodiments, pressure sensors 260 provide a pressure reading that corresponds to downward forces applied to the lift pins of the chuck via the wafer during the de-chucking process. This disclosure is not limited to this operational description. It is to be appreciated that additional operations may be performed. Moreover, not all operations may be needed to perform the disclosure provided herein. Further, some of the operations may be performed simultaneously, or in a different order than shown in FIG. 9. In some implementations, one or more other operations may be performed in addition to or in place of the presently described operations.

Figure 11:
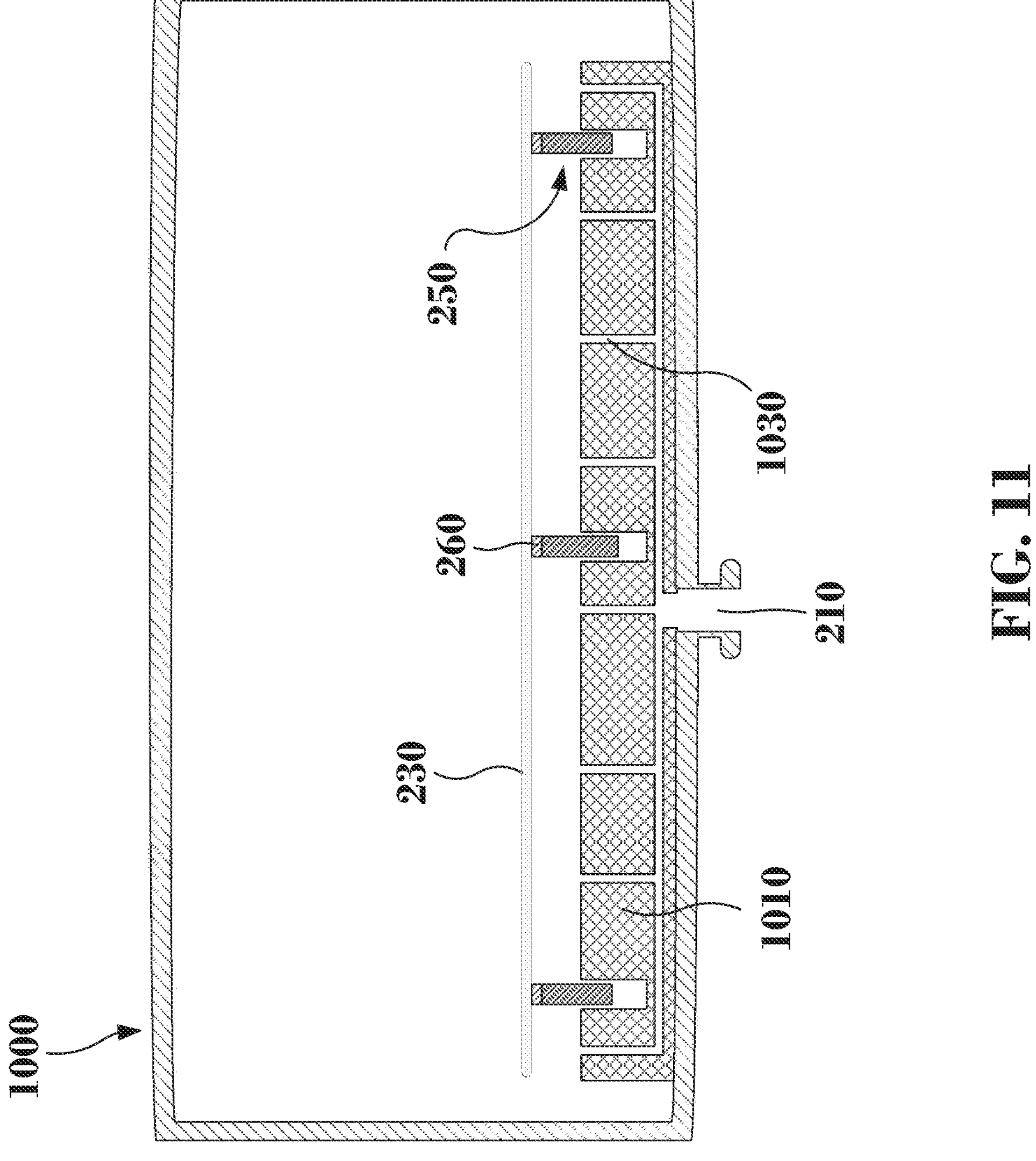
FIG. 11 is a cross-sectional view of an exemplary processing module with a wafer resting on the module's chuck and forces applied on the wafer, according to some embodiments.

Exemplary method 900 begins with operation 910. In some embodiments, operation 910 is similar to operation 110 of method 100 shown in FIG. 1. For example, and referring to FIG. 11, a wafer 230 is transferred in a processing module 1000 and placed on the lift pins 250 of the module's vacuum chuck 1010. The wafer can be transferred in processing module 1000 via a robotic arm.

Exemplary method 900 continues with operation 920. In some embodiments, operation 920 is similar to operation 120 of method 100 shown in FIG. 1. For example, and referring to FIG. 11, wafer 230 rests on top surface 260*s* of pressure sensors 260 of chuck 1010. In some embodiments, when lift pins 250 are raised and wafer 230 rests on top surface 260*s* of pressure sensors 260, pressure sensors 260 can measure a pressure exerted on lift pins 250 that corresponds to the weight of wafer 230. For example, the pressure on each lift pin 250, when wafer 230 is resting on raised lift pins 250 can be described with the following formula:

$$P1 = \frac{\text{Force due to the wafer weight}}{\text{Area of pressure sensor} \times \text{Number of lift pins}},$$

where the "Area of the pressure sensor" refers to the area of pressure sensor 260 that is in contact with wafer 230—e.g., area of top surface 260*s*, shown in FIG. 3. From the above mentioned equation, the weight of the wafer can be calculated if the area of top surface 260*s* is known.

In referring to FIGS. 9 and 10, exemplary method 900 continues with operation 930, where a differential pressure is applied to the wafer. According to some embodiments, the differential pressure secures wafer 230 on chuck 1010. In referring to FIG. 10, chuck 1010 can be equipped with small pin holes 1030 that extend through the body of chuck 1010. Further, small pin holes 1030 can be connected via the bottom of chuck 1010 to an external pump line via exhaust openings 210, which can create a vacuum between the top surface of chuck 1010 and the backside surface of wafer 230. As a result, a differential pressure builds between the top surface and the backside surface of wafer 230, which gives rise to downforce 1020 on wafer 230, as discussed above.

Exemplary method 900 continues with method 940, where the wafer is processed. In some embodiments, method 940 is similar to operation 140. For example, the wafer processing can include material deposition, material etching, chemical mechanical polishing, photolithography operations, wafer cleaning operations, or any operations employed in semiconductor manufacturing.

In operation 950 of exemplary method 900, a gas is flown to equalize the differential pressure between the top and backside surface of wafer 230. By way of example and not limitation, an inert gas can be released through pin holes 1030 of chuck 1010 to increase the pressure on the backside surface of wafer 230. The inert gas may include argon, xenon, helium, etc. In some embodiments, operation 950 can be performed for a predetermined amount of time.

In operation 960 of exemplary method 900, the lift pins are pressed against wafer 230 and process sensors 260 can measure a second pressure P2. According to some embodiments, second pressure P2 on each lift pin 250 can be determined with the following formula:

$$P2 = \frac{\text{Force due to the wafer weight} + F_{Dif}}{\text{Area of pressure sensor} \times \text{Number of lift pins}},$$

where $F_{Dif}$ is the downforce corresponding to the differential pressure between the top and backside surface of wafer 230, as discussed above. The second pressure P2, therefore, corresponds to the sum of the downforces due to (i) the weight of wafer 230, and (ii) the differential pressure on the wafer due to the vacuum created on its backside.

In some embodiments, operation 960 begins concurrently with operation 950. For example, the gas in operation 950 is flown while a second pressure is measured according to operation 960. In some embodiments, and at the beginning of operation 950, second pressure P2 is greater than first pressure P1. However, over time, second pressure P2 becomes equal to pressure P1 as the differential pressure on wafer 230 is reversed. This scenario is not limiting and operation 960 may begin after operation 950, and second pressure P2 can be measured once operation 950 has concluded (e.g., when the gas has stopped flowing).

According to operation 970, a determination is made whether the second pressure is equal to the first pressure. For example, if operation 950 is successful and the differential pressure applied to the wafer is reversed, second pressure P2 will be equal to first pressure P1. Therefore, wafer 230 can be lifted by lifting pins 250 (e.g., it can be de-chucked), according to operation 980. On the other hand, if a residual differential pressure remains on wafer 230 and the second pressure is higher than the first pressure, operation 950 can be repeated as necessary until the measured pressure in operation 960 becomes equal to first pressure P1 measured in operation 920. For example, after operation 950 has been repeated, pressure sensors 260 are pressed against wafer 230 to measure a "third pressure P3." A determination is made whether the third pressure is equal to the first pressure, according to operation 970. If third pressure P3 is equal to first pressure P1, wafer 230 can be de-chucked according to operation 980.

From the above description, pressure sensors 260 can measure the pressure either continuously or intermittently during operation 950, or at the end of operation 950. According to some embodiments, different combinations and permutations of operations 950 through 980 of exemplary method 900 are within the spirit and the scope of this disclosure.

The present disclosure is directed to a method that prevents pre-mature de-chucking in processing modules. The method utilizes pressure sensors on a wafer lift mechanism (e.g., lift pins) that are configured to measure a pressure exerted on the wafer prior to performing a de-chucking operation. According to some embodiments, the measured pressure can be used to gauge whether downforces acting on the wafer can interfere with the de-chucking process (e.g., obstruct the de-chucking process). In some embodiments, the measured pressure corresponds to a force due to the weight of the wafer, an electrostatic force, a force due to a differential pressure, or combination of thereof. According to some embodiments, if the measured pressure is equal to the pressure corresponding to the weight of the wafer, the lift mechanism can raise the wafer from the chuck. Accordingly, if the measured pressure is greater than the pressure corresponding to the weight of the wafer, the wafer remains on the chuck until the measured pressure becomes equal to the pressure corresponding to the weight of the wafer.

In some embodiments, a method includes placing a wafer onto a chuck equipped with lift pins. One or more of the lift pins include a pressure sensor that is configured to measure a pressure exerted by the wafer. The method further includes measuring a first pressure that is applied to the one or more lift pins by the wafer, lowering the lift pins to place the wafer on the chuck, applying a first voltage to the wafer through the chuck, and processing the wafer. The method also includes removing the wafer from the chuck by applying a second voltage to the wafer, flowing a gas over the wafer to remove a residual electrostatic charge, and pressing the one or more lift pins against the wafer to measure a second pressure exerted by the wafer. If the measured second pressure is substantially equal to the first pressure, the wafer can be raised above the chuck with the lift pins.

In some embodiments, a processing module includes a chuck, a wafer lift mechanism, and a gas source configured to flow a gas over the wafer in response to the measured pressure being greater than a pressure corresponding to a weight of the wafer. The wafer lift mechanism further includes (i) lift pins configured to raise a wafer from the chuck or lower the wafer on the chuck and (ii) a pressure sensor on one or more lift pins, where the pressure sensor is configured to measure a pressure exerted on each lift pin by the wafer.

In some embodiments, a method includes placing a wafer onto a chuck equipped with lift pins, where one or more of the lift pins include a pressure sensor configured to measure a pressure exerted by the wafer. The method further includes resting the wafer on the lift pins above the chuck to measure a first pressure applied to the one or more lift pins by the wafer and lowering the lift pins to place the wafer on the chuck. The method also includes processing the wafer and removing the wafer from the chuck, where removing the wafer includes: flowing a gas over the wafer, pressing the lift pins against the wafer to measure a second pressure exerted on the one or more lift pins by the wafer. If the measured second pressure is substantially equal to the first pressure, the wafer can be raised above the chuck with the lift pins.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A processing module, comprising:

a chuck;

a wafer lift mechanism comprising one or more lift pins configured to raise a wafer from the chuck or lower the wafer onto the chuck, wherein the one or more of the lift pins comprises a pressure sensor configured to measure a pressure exerted on the one or more lift pins by the wafer, and wherein the pressure comprises a weight of the wafer and a differential pressure due to a vacuum created on a backside of the wafer by the chuck; and a gas source configured to flow a gas over the wafer in response to the measured pressure being greater than a pressure corresponding to a weight of the wafer.

2. The processing module of claim 1, wherein the pressure sensor has a cross-sectional area that is substantially equal to or smaller than a cross-sectional area of the one or more lift pins.

3. The processing module of claim 1, wherein the gas comprises an inert gas.

4. The processing module of claim 1, wherein the gas comprises helium, argon, xenon, or neon.

5. The processing module of claim 1, wherein the pressure sensor is configured to be pressed against a backside surface of the wafer to measure the pressure exerted on the one or more lift pins by the wafer.

6. The processing module of claim 1, wherein the pressure sensor is disposed on a top surface of the one or more lift pins and has a diameter that ranges from about 1 mm to about 5 mm.

7. The processing module of claim 1, wherein the wafer lift mechanism comprises three or more lift pins with pressure sensors thereon.

8. The processing module of claim 1, wherein each of the one or more lift pins is configured to maintain a respective pressure sensor at a temperature below about 110° C.

9. The processing module of claim 1, wherein the pressure sensor is further configured to transmit a pressure reading that corresponds to the measured pressure via one or more of a wired connection, a wireless connection, and combinations thereof.

10. The processing module of claim 1, wherein the chuck is one of a vacuum chuck.

11. A processing module, comprising:

a chuck with lift pins configured to raise and lower a wafer;

a pressure sensor integrated into one or more of the lift pins, the pressure sensor configured to:

measure a pressure exerted by the wafer on the lift pins; and measure a differential pressure at a backside of the wafer relative to that at a front side of the wafer, wherein the differential pressure is due to a vacuum provided by the chuck; and a gas line configured to flow an inert gas over the wafer.

12. The processing module of claim 11, wherein the chuck is a vacuum chuck configured to apply the differential pressure to the wafer to secure the wafer onto the chuck.

13. The processing module of claim 12, wherein the gas line is configured to equalize the differential pressure by flowing the inert gas to release the wafer from the chuck.

14. The processing module of claim 11, wherein the inert gas increases a pressure on the backside of the wafer.

15. The processing module of claim 11, wherein each of the lift pins is hollow.

16. The processing module of claim 11, wherein water is circulated through a hollow portion of each of the lift pins.

17. The processing module of claim 11, wherein the chuck is configured to release an inert gas through a plurality of holes to increase a pressure on the backside of the wafer.

18. A chuck, comprising:

a plurality of lift pins configured to:

lower a wafer; and raise the wafer after a wafer process is completed; and a pressure sensor incorporated as a cylindrical cap on a top surface of each one of the plurality of lift pins, wherein the pressure sensor is configured to measure a pressure exerted on the one or more lift pins by the wafer, and wherein the pressure comprises a weight of the wafer and a differential pressure due to a vacuum created on a backside of the wafer by the chuck.

19. The chuck of claim 18, wherein the pressure sensor is one or more of an electromagnetic pressure sensor, a capacitive pressure sensor, a piezoresistive pressure sensor, and an optical pressure sensor.

20. The chuck of claim 18, wherein the pressure sensor comprises a wireless transmitter.

* * * * *